(12) United States Patent
Liaw

(10) Patent No.: US 10,978,460 B2
(45) Date of Patent: Apr. 13, 2021

(54) SEMICONDUCTOR STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 92 days.

(21) Appl. No.: 16/383,957

(22) Filed: Apr. 15, 2019

(65) Prior Publication Data

US 2020/0328216 A1     Oct. 15, 2020

(51) Int. Cl.
| | |
|---|---|
| *H01L 27/11* | (2006.01) |
| *H01L 23/528* | (2006.01) |
| *H01L 23/522* | (2006.01) |
| *H01L 23/532* | (2006.01) |
| *H01L 21/027* | (2006.01) |
| *H01L 27/092* | (2006.01) |
| *H01L 21/768* | (2006.01) |
| *H01L 21/311* | (2006.01) |

(52) U.S. Cl.
CPC ...... *H01L 27/1104* (2013.01); *H01L 23/5226* (2013.01); *H01L 23/5286* (2013.01); *H01L 23/53228* (2013.01); *H01L 23/53257* (2013.01); *H01L 21/0274* (2013.01); *H01L 21/31111* (2013.01); *H01L 21/76802* (2013.01); *H01L 21/76877* (2013.01); *H01L 27/0924* (2013.01); *H01L 27/0928* (2013.01)

(58) Field of Classification Search
CPC ............. H01L 27/1104; H01L 23/5286; H01L 23/5226; H01L 23/53228; H01L 23/53257; H01L 21/0274; H01L 27/0928; H01L 21/76802; H01L 21/76877; H01L 21/31111; H01L 27/0924
USPC ...................................................... 257/369
See application file for complete search history.

(56) References Cited

U.S. PATENT DOCUMENTS

| | | | |
|---|---|---|---|
| 7,940,542 B2 * | 5/2011 | Funane | H01L 27/1104 365/51 |
| 8,947,902 B2 | 2/2015 | Liaw | |
| 8,976,573 B2 | 3/2015 | Liaw | |
| 9,349,436 B2 | 5/2016 | Liaw | |
| 9,424,889 B1 * | 8/2016 | Liaw | G11C 8/16 |

(Continued)

*Primary Examiner* — Duy T Nguyen
(74) *Attorney, Agent, or Firm* — McClure, Qualey & Rodack, LLP

(57) ABSTRACT

Semiconductor structures are provided. A semiconductor structure includes a memory cell and a logic cell. The memory cell includes a latch circuit formed by two cross-coupled inverters, and a pass-gate transistor coupling an output of the latch circuit to a bit line. A first source/drain region of the pass-gate transistor is electrically connected to the bit line through a first contact over the first source/drain region and a first via over the first contact. The logic cell includes a transistor. A second source/drain region of the transistor is electrically connected to a local interconnect line through a second contact over the second source/drain region and a second via over the second contact. The first and second vias are the same height. The interconnect line and the bit line are formed in the same metal layer, and the bit line is thicker than the interconnect line.

20 Claims, 12 Drawing Sheets

(56) References Cited

U.S. PATENT DOCUMENTS

| | | |
|---|---|---|
| 9,576,644 B2 | 2/2017 | Liaw |
| 9,583,438 B2 | 2/2017 | Liaw et al. |
| 9,704,564 B2 | 7/2017 | Liaw |
| 9,865,542 B2 | 1/2018 | Liaw et al. |
| 9,935,001 B2 | 4/2018 | Liaw |
| 2013/0026580 A1* | 1/2013 | Morimoto ............ G11C 11/412 257/369 |
| 2013/0181297 A1* | 7/2013 | Liaw .................. H01L 27/0886 257/390 |
| 2017/0221905 A1* | 8/2017 | Chen .................. H01L 23/5226 |
| 2017/0317065 A1* | 11/2017 | Hirose ............... H01L 23/5226 |

* cited by examiner

SEMICONDUCTOR STRUCTURE

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

Memories are commonly used in ICs. For example, a static random access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

The semiconductor industry has experienced rapid growth due to continuous improvements in the integration density of a variety of electronic components (e.g., memory cells and standard cells). Therefore, metal routing efficiency is important for decreasing the complexity of IC designs.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
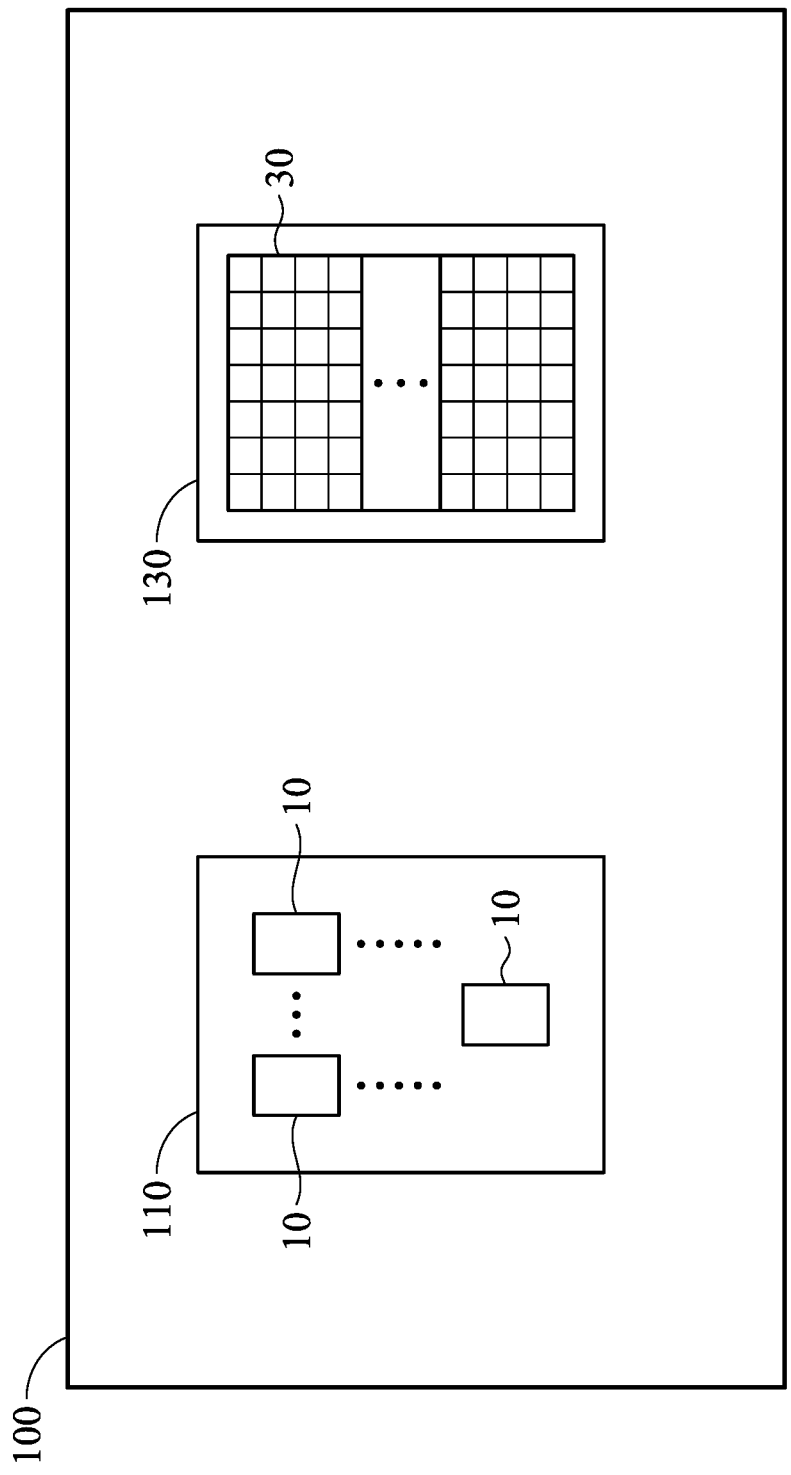
FIG. 1 is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1 is a simplified diagram of an IC 100, in accordance with some embodiments of the disclosure. The IC 100 includes a circuit 110 and a memory 130. In some embodiments, the circuit 110 may be the controller for accessing the memory 130. In some embodiments, the configuration setting of operations of the circuit 110 is stored in the memory 130. The circuit 110 includes multiple logic cells 10. In some embodiments, the logic cell 10 may be a standard cell (STD cell). For example, the logic cells 10 may be the standard cells corresponding to the same logic gates (e.g., inverter (INV), AND, OR, NAND, NOR, Flip-Flop, SCAN, etc.) or different logic gates. The memory 130 includes multiple memory cells 30 arranged in rows and columns of an array. In some embodiments, the memory cells 30 have the same circuit configuration and the same semiconductor structure. In some embodiments, the memory cell 30 may be a bit cell of SRAM or DRAM.

In some embodiments, the transistors in the IC 100 are selected from a group consisting of finFET structure, vertical gate all around (GAA), horizontal GAA, nano wire, nano sheet, or a combination thereof.

In some embodiments, the channel regions of the PMOS transistors in the IC 100 are SiGe content channel region.

Figure 2A:
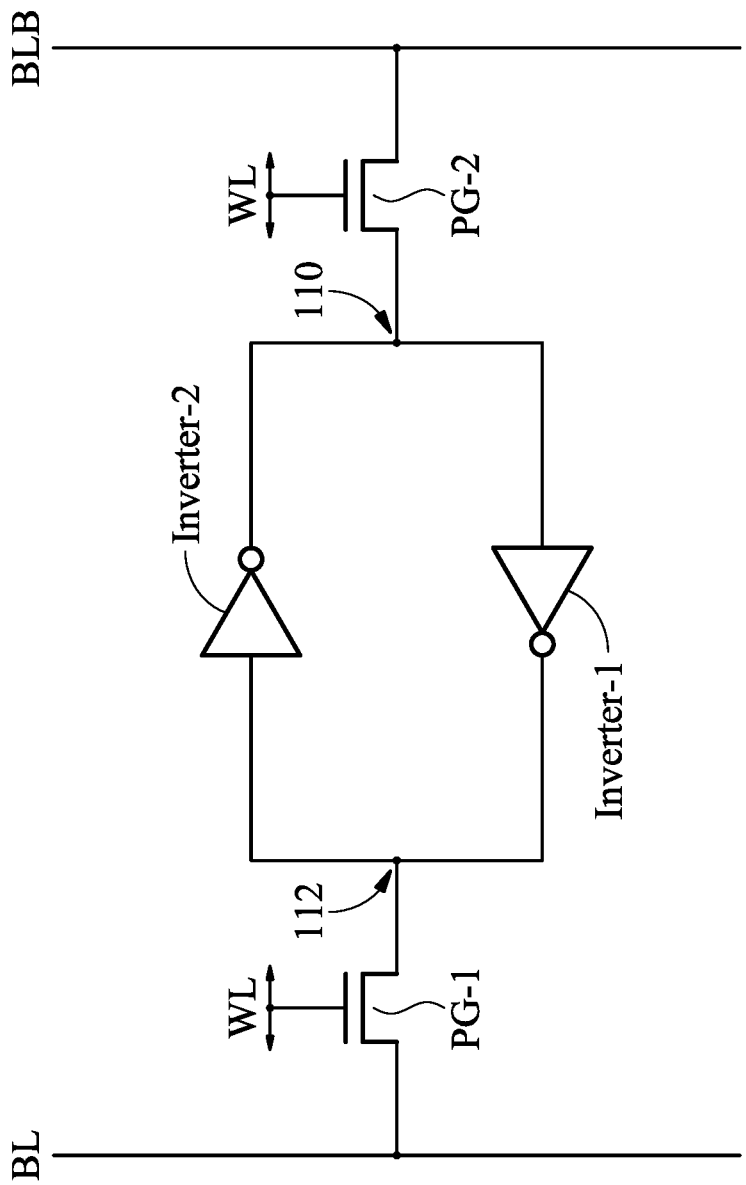
FIG. 2A illustrates a memory cell, in accordance with some embodiments of the disclosure.

FIG. 2A illustrates a memory cell 30, in accordance with some embodiments of the disclosure. In this embodiment, the memory cell 30 is a single-port SRAM bit cell. The memory cell 30 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL and the node 112, and the pass-gate transistor PG-2 is coupled between a complementary bit line BLB and the node 110. The complementary bit line BLB is complementary to the bit line BL. The gates of the pass-gate transistors PG-1 and PG-2 are coupled to the same word-line WL. In some embodiments, the pass-gate transistors PG-1 and PG-2 are NMOS transistors.

Figure 2B:
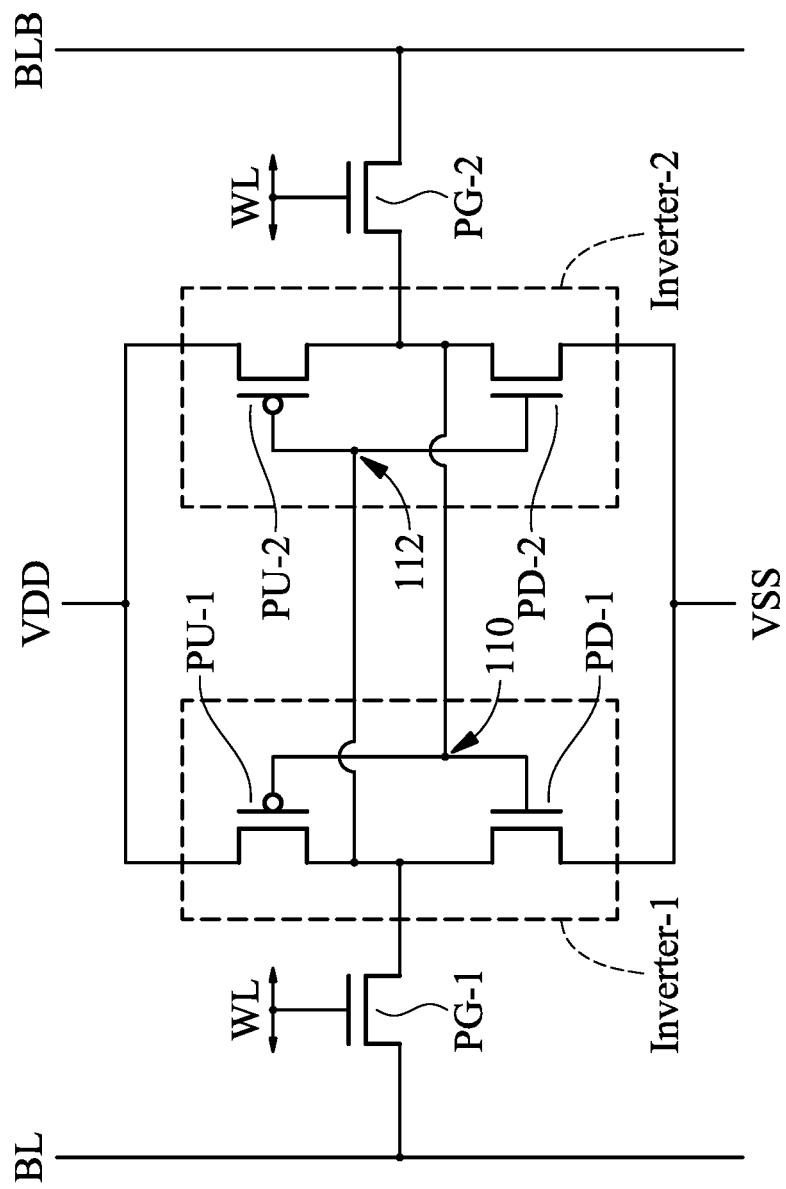
FIG. 2B shows a simplified diagram of the memory cell of FIG. 2A, in accordance with some embodiments of the disclosure.

FIG. 2B shows a simplified diagram of the memory cell 30 of FIG. 2A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the memory cell 30 are selected from a group consisting of finFET structure, vertical gate all around (GAA), horizontal GAA, nano wire, nano sheet, or a combination thereof.

FIGS. 3A through 3D illustrate block diagrams of a layout of features of the memory cell 30, in accordance with some embodiments of the disclosure. FIGS. 3A through 3D illustrate features in different levels of the memory cell 30. In such embodiments, the memory cell 30 is a single-port SRAM bit cells of FIGS. 2A and 2B. Furthermore, an outer boundary of the memory cell 30 is illustrated using dashed lines.

Figure 3A:
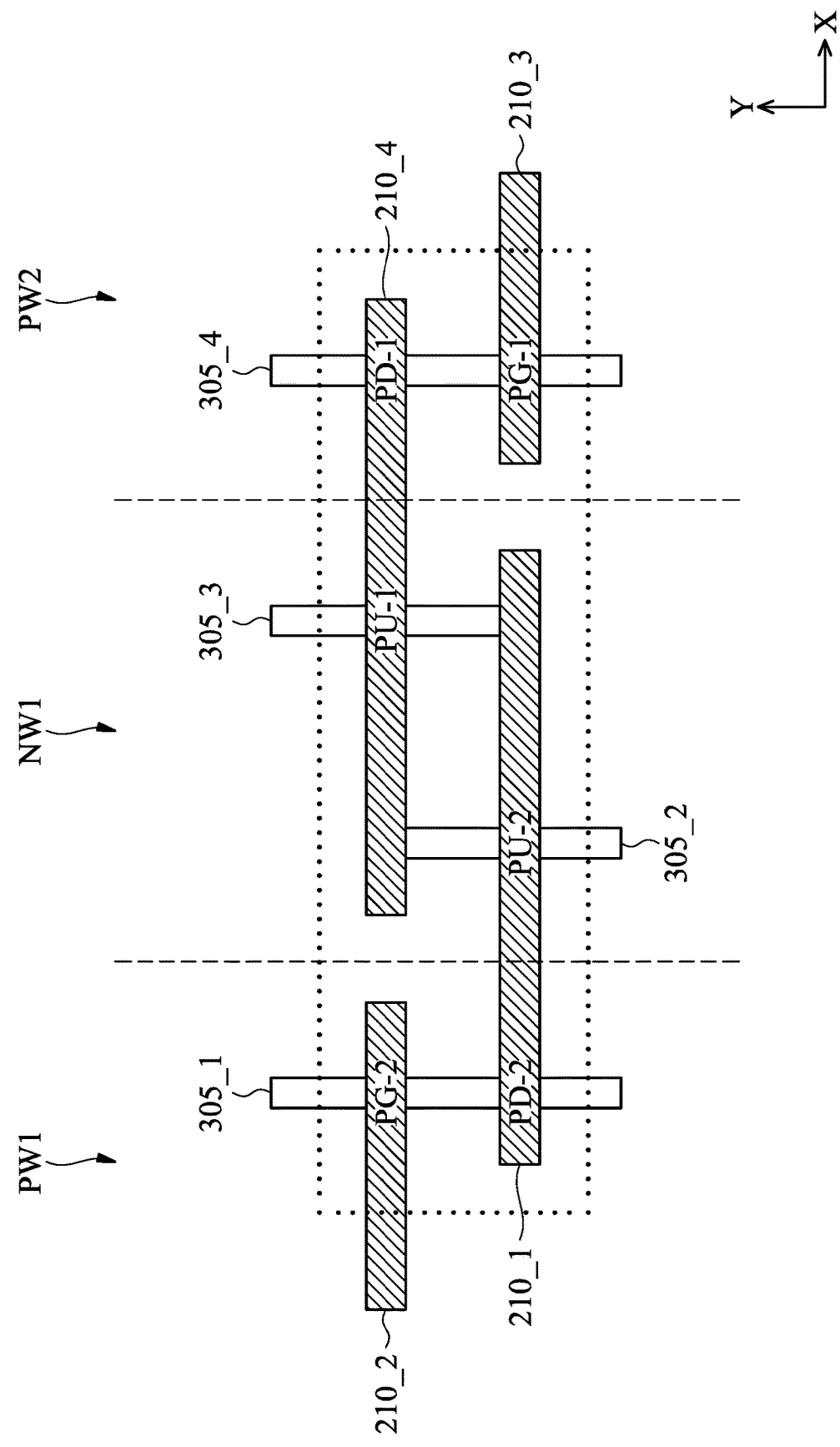
FIGS. 3A through 3D illustrate block diagrams of a layout of features of the memory cell, in accordance with some embodiments of the disclosure.

In FIG. 3A, an N-type well region NW1 is at the middle of memory cell 30, and two P-type well regions PW1 and PW2 are on opposite sides of N-type well region NW1. A gate electrode 210_1 forms the pull-up transistor PU-2 with an underlying active region 305_2 in the N-type well region NW1. In some embodiments, the active region 305_2 is fin-based and includes one or more fin structures disposed under the gate electrode 210_1 (e.g., the gate electrode 210_1 may be disposed over and extend along sidewalls of the active region 305_2). Furthermore, the active region 305_2 below the gate electrode 210_1 forms a channel region of the pull-up transistor PU-2. The gate electrode 210_1 further forms the pull-down transistor PD-2 with the underlying active region 305_1 in P-type well region PW1 (e.g., on the left side of N-type well region NW1). In other words, the gate electrode 210_1 is shared by the pull-up transistor PU-2 and the pull-down transistor PD-2. In some embodiments, the active region 305_1 is fin-based and includes one or more continuous fin structures disposed under the gate electrode 210_1 (e.g., the gate electrode 210_1 may be disposed over and extend along sidewalls of the active region 305_1). Furthermore, the active region 305_1 below the gate electrode 210_1 forms a channel region of the pull-down transistor PD-2.

The gate electrode 210_2 forms the pass-gate transistor PG-2 with the active region 305_1. In other words, the active region 305_1 is shared by the pass-gate transistor PG-2 and the pull-down transistor PD-2. In some embodiments, the gate electrode 210_2 is disposed over and extends along sidewalls of the active region 305_1. Furthermore, the active region 305_1 below the gate electrode 210_2 forms a channel region of the pass-gate transistor PG-2.

In FIG. 3A, the gate electrode 210_4 forms the pull-up transistor PU-1 with an underlying active region 305_3 in the N-type well region NW1. In some embodiments, the active region 305_3 is fin-based and includes one or more fin structures disposed under the gate electrode 210_4 (e.g., the gate electrode 210_4 may be disposed over and extend along sidewalls of the active region 305_3). Furthermore, the active region 305_3 below the gate electrode 210_4 forms a channel region of the pull-up transistor PU-1. The gate electrode 210_4 further forms the pull-down transistor PD-1 with an underlying active region 305_4 in the P-type well region PW2 (e.g., on the right side of the N-type well region NW1 and opposing the P-type well region PW1). In other words, the gate electrode 210_4 is shared by the pull-up transistor PU-1 and the pull-down transistor PD-1. In some embodiments, the active region 305_4 is fin-based and includes one or more fin structures disposed under the gate electrode 210_4 (e.g., the gate electrode 210_4 may be disposed over and extend along sidewalls of the active region 305_4). Furthermore, the active region 305_4 below the gate electrode 210_4 forms a channel region of the pull-down transistor PD-1.

In FIG. 3A, the gate electrode 210_3 forms the pass-gate transistor PG-1 with the underlying active region 305_4. In other words, the active region 305_4 is shared by the pass-gate transistor PG-1 and the pull-down transistor PD-1. In some embodiments, the gate electrode 210_3 is disposed over and extends along sidewalls of the active region 305_4. Furthermore, the active region 305_4 below the gate electrode 210_3 forms a channel region of the pass-gate transistor PG-1.

The gate electrodes 210_1 through 210_4 are parallel to the same direction (e.g., the X-direction), and the active regions 305_1 through 305_4 are parallel to the same direction (e.g., the Y-direction). In other words, the extenstion direction of the active regions 305_1 through 305_4 is perpendicular to the extenstion direction of gate electrodes 210_1 through 210_4.

In the memory cell 30 of FIG. 3A, the pass-gate transistors PG-1 and PG-2, the pull-up transistors PU-1 and PU-2, and the pull-down transistors PD-1 and PD-2 are FinFETs, and the active regions 305_1 through 305_4 include one or more fin structures. The active regions 305_1 through 305_4 provide source/drains of various transistors on opposing sides of a respective gate electrode.

In FIG. 3A, each of the active regions 305_1 through 305_4 includes a single fin. In some embodiments, there may be a single fin, two fins, three fins, or more for the active regions 305_1 through 305_4. Furthermore, the number of fins in the active regions 305_1 through 305_4 may be the same as or different than other active regions in the memory cell 30.

Figure 3B:
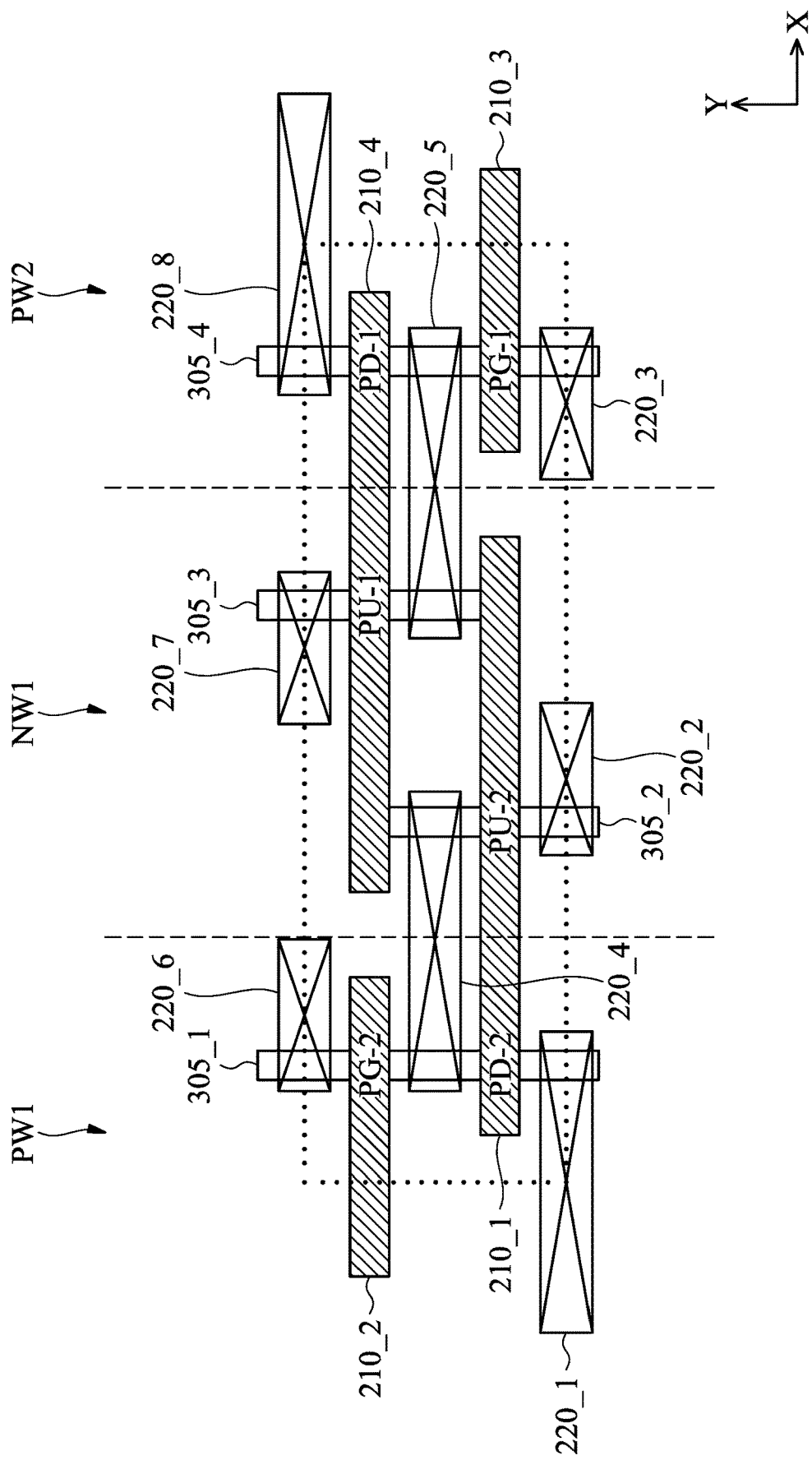

FIG. 3B shows features of the memory cell 30 in a contact level and lower. The contact level may include the source/drain contacts (also referred to as "contact") for connecting the source/drain regions of transistors (e.g., PG-1, PG-2, PD-1, PD-2, PU-1 and PU-2 of FIG. 2B) to the overlying level. In some embodiments, the contact level may further include the gate contacts (also referred to as contact plugs) for connecting the gate electrodes of the transistors (e.g., PG-1, PG-2, PD-1, PD-2, PU-1 and PU-2 of FIG. 2B) to an overlying level.

In FIG. 3B, each of the source/drain contacts 220_4 and 220_5 is a longer contact, and is elongated and has a longitudinal direction in the X-direction, which is parallel to the extending directions of the gate electrodes 210_1 through 210_4. Each of the source/drain contacts 220_4 and 220_5 has a rectangular shape which has a longer side along the X-direction and a shorter side along the Y-direction.

The source/drain contact 220_4 is used to connect the drain regions of the pull-down transistor PD-2, the pull-up transistor PU-2 and the source/drain region of the pass-gate transistor PG-2. The source/drain contact 220_5 is used to connect the drain regions of the pull-down transistor PD-1, the pull-up transistor PU-1 and the source/drain region of the pass-gate transistor PG-1.

The source/drain contacts 220_1 and 220_8 are used to connect to the source regions of the pull-down transistors PD-2 and PD-1 to the ground lines CVss (e.g., the electrical ground lines VSS), and, and the ground lines CVss will be described below. The source/drain contacts 220_1 and 220_8 have lengthwise directions parallel to the X direction, and may be formed to overlap the corners (e.g., the upper right corner and the lower left corner of outer boundary formed by dashed lines) of the memory cell 30. Furthermore, the source/drain contacts 220_1 and 220_8 may further extend into neighboring memory cells 30 in a different column adjacent the memory cell 30. The source/drain contacts 220_1 and 220_8 may further be shared by two neighboring memory cells 30 in the adjacent rows.

Additionally, the source/drain contacts 220_2 and 220_7 are used to connect to the source regions of pull-up transistors PU-2 and PU-1 to the power lines CVdd (e.g., power supply lines coupled to the positive power supply node VDD), and the power line CVdd will be described below. The source/drain contacts 220_2 and 220_7 may further be shared by two neighboring memory cells 30 in the adjacent rows.

The source/drain contacts 220_3 and 220_6 are used to connect to the source/drain regions of pass-gate transistors PG-1 and PG-2 to a bit line BL and a complementary bit line BLB, respectively. The source/drain contacts 220_3 and 220_6 may further be shared by two neighboring memory cells in the adjacent rows. Each of the source/drain contacts 220_3 and 220_6 has a rectangular shape which has a longer side along the X-direction and a shorter side along the Y-direction.

Figure 3C:
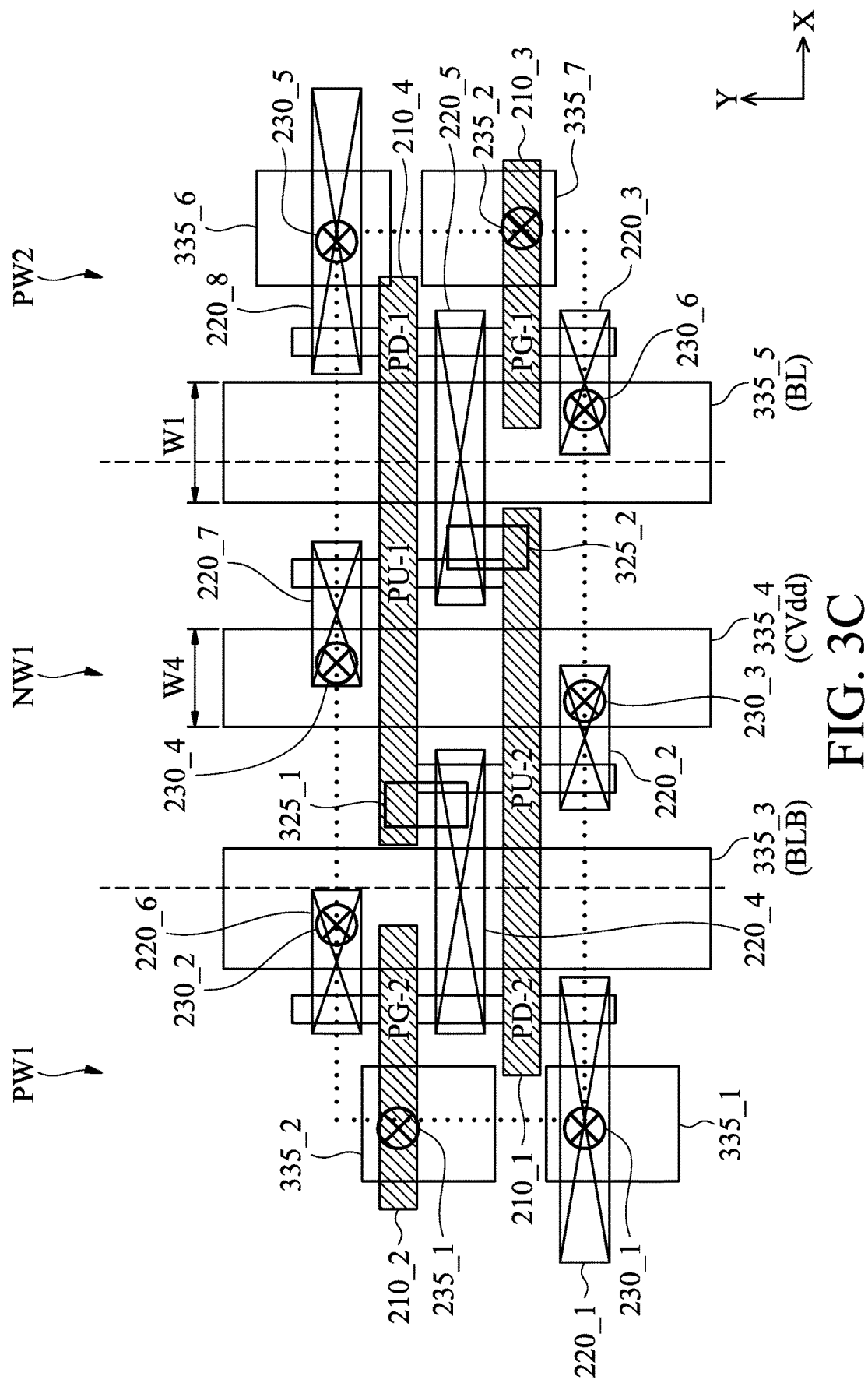

FIG. 3C shows features of the memory cell 30 in a metal layer level M1 (not shown), a via level via_0 (not shown) and lower. The vias 230_1 through 230_6, the gate vias 235_1 and 235_2, and the vias 325_1 and 325_2 are disposed in the via level via_0. Furthermore, the conductive lines 335_1 through 335_7 are disposed in the metal layer level M1 over the via level via_0. For example, various conductive lines in the metal layer level M1 are disposed over various vias of the via level via_0. In some embodiments, the conductive lines 335_1 through 335_7 are parallel to the Y-direction.

The gate vias 235_1 and 235_2 are connected to the gate electrodes 210_2 and 210_3. The gate vias 235_1 and 235_2 are further connected to the conductive lines 335_2 and 335_7, which may be used to electrically couple the gate electrodes of the pass gate transistors PG-2 and PG-1 to one or more word lines WL, and the word line WL will be described below. Furthermore, the conductive lines 335_2 and 335_7 may further extend into and be shared by neighboring memory cells in the adjacent columns, and may further be shared by two neighboring memory cells in different rows.

Furthermore, the vias 230_1 and 230_5 are connected to the source/drain contacts 220_1 and 220_8 (e.g., the source contacts of the pull-down transistors PD-2 and PD-1), respectively. The vias 230_1 and 230_5 are further connected to the conductive lines 335_1 and 335_6, respectively, and the vias 230_1 and 230_5 may be used to electrically couple sources of the pull-down transistors PD-2 and PD-1 to the ground lines CVss, and the ground lines CVss will be described below. Furthermore, the vias 230_1 and 230_5 and the conductive lines 335_1 and 335_6 may further extend into neighboring memory cells in the adjacent columns, and may further be shared by two neighboring memory cells in different rows.

Additionally, the vias 230_3 and 230_4 are connected to the source/drain contacts 220_2 and 220_7 (e.g., the source contacts of the pull-up transistors PU-2 and PU-1). The vias 230_3 and 230_4 are further connected to the conductive line 335_4. In such embodiments, the conductive line 335_4 functions as the power line CVdd, and the vias 230_3 and 230_4 electrically connects the sources of the pull-up transistors PU-2 and PU-1 to the power line CVdd. The conductive line 335_4 has a width W4. The vias 230_3 and 230_4 may further be shared by two neighboring memory cells in different rows. In some embodiment, the conductive line 335_4 is shared by all memory cells in the same column.

The via 325_1 is a butt via, and includes a first portion over, and electrically connected to, the gate electrode 210_4, and a second portion over, and electrically connected to, the source/drain contact 220_4. Furthermore, the via 325_2 is a butt via, and includes a first portion over, and electrically connected to, the gate electrode 210_1, and a second portion over, and electrically connected to, the source/drain contact 220_5. In some embodiments, the vias 325_1 and 325_2 have a longitudinal direction in the Y-direction. In the manufacturing of the memory cell 30 on the semiconductor wafers, the vias 325_1 and 325_2 may be formed as a single continuous butt via.

In some embodiments, each of the vias 325_1 and 325_2 is a local-connection layer for connecting the corresponding gate electrode and the corresponding source/drain contact. In some embodiments, the vias 325_1 and 325_2, the vias 230_1 through 230_6, and the gate vias 235_1 and 235_2 are coplanar. In some embodiments, the vias 325_1 and 325_2, the vias 230_1 through 230_6, and the gate vias 235_1 and 235_2 are made of the same metal material.

In FIG. 3C, the vias 230_2 and 230_6 are connected to the source/drain contacts 220_6 and 220_3 (e.g., the sources of the pass-gate transistors PG-2 and PG-1), respectively. The via 230_2 is further connected to the conductive line 335_3. In such embodiments, the conductive line 335_3 functions as a complementary bit line BLB, and the via 230_2 electrically connects the source/drain region of pass-gate transistor PG2 to the complementary bit line BLB. Furthermore, the via 230_6 is further connected to the conductive line 335_5. In such embodiments, the conductive line 335_5 functions as a bit line BLB, and the via 230_6 is connects the source/drain region of pass-gate transistor PG1 to the bit line BL. In some embodiments, the conductive line 335_3 electrically connects the source/drain region of pass-gate transistor PG2 to a bit line BL, and the conductive line 335_5 electrically connects the source/drain region of pass-gate transistor PG1 to a complementary bit line BLB. The vias 230_2 and 230_6 may be shared by two neighboring memory cells in different rows. In such embodiments, the conductive lines 335_3 and 335_5 have the same width W1 that is narrower than the conductive line 335_4, i.e., W4>W1.

In some embodiments, the vias 230_1 through 230_6 have a circular shape with the same diameter that is less than the width of the source/drain contacts 220_1 through 220_8. In some embodiments, the widths of the source/drain contacts 220_1 through 220_8 are the same. In some embodiments, the vias 230_1 through 230_6 have a rectangular shape.

Figure 3D:
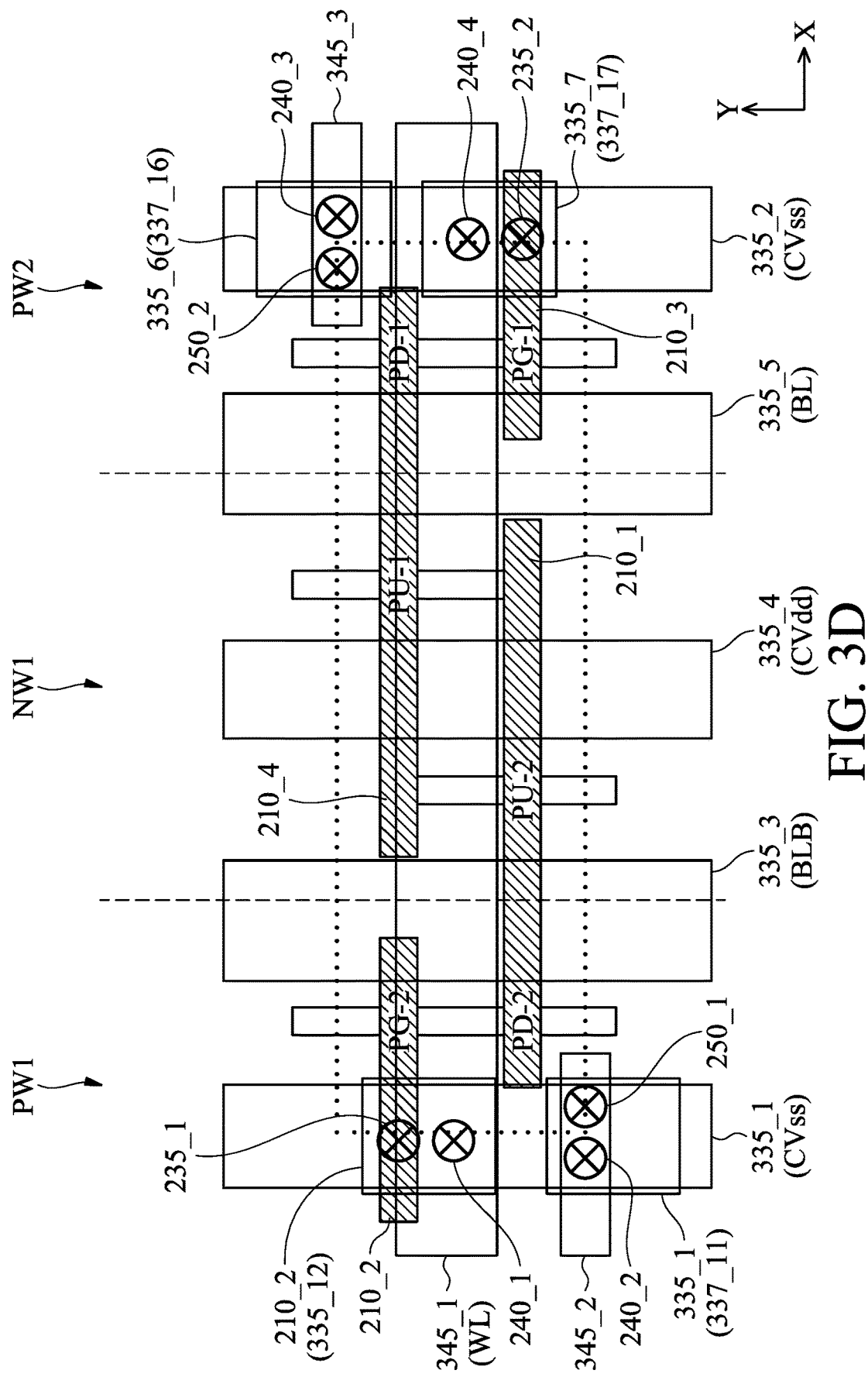

FIG. 3D shows features of the memory cell 30 in a metal layer level M2 (not shown) and a via level via_1 (not shown) and lower. The vias 240_1 through 240_4 are disposed in the via level via_1, and the conductive lines 345_1 through 345_3 are disposed in the metal layer level M2 over the via level via_1. For example, various conductive lines in the metal layer level M2 are disposed over various vias in the via level via_1. In some embodiments, the conductive lines 345_1 through 345_3 are parallel to the X-direction.

In some embodiments, the conductive lines 335_1 through 335_6 have the same thickness T1. In some embodiments, the conductive lines 335_1, 335_2, 335_6 and 335_7 are replaced with the conductive lines 337_11, 337_12, 337_17 and 337_18, and the conductive lines 337_11, 337_12, 337_17 and 337_18 have thickness T2 which is thinner than thickness T1. The difference between thickness T1 and thickness T2 is described below.

In FIG. 3D, the vias 240_1 and 240_4 are connected to the conductive line 345_1. In such embodiments, the conductive line 345_1 functions as a word line WL, and the vias 240_1 and 240_4 electrically connect the gate vias 235_1 and 235_2 (e.g., the gate vias for the pass-gate transistors PG-2 and PG-1) to the word line WL. In some embodiments, the memory cells 30 in the same row share the same word line WL, which is used to select or de-select memory cells 30. In some embodiments, the word line WL is further coupled to the upper layer over the conductive line 345_1.

The vias 240_2 and 240_3 are connected to the conductive lines 345_2 and 345_3, respectively, so as to electrically connect the conductive lines 335_1 and 335_6 to the ground line CVss. As described above, the conductive lines 335_1 and 335_6 in the first metal layer M1 is coupled to the source/drain contacts 220_1 and 220_8 of FIG. 3C (e.g., the source contacts for pull-down transistors PD-2 and PD-1). The conductive lines 345_2 and 345_3 may further extend into and be shared by the neighboring memory cells 30 in the different columns and/or rows.

FIG. 3D further shows features of the memory cell 30 in a metal layer level M3 (not shown) and a via level via_2 (not shown) and lower. The vias 250_1 and 250_2 are disposed in the via level via_2, and the conductive lines 355_1 and 355_2 are disposed in the metal layer level M3 over the via level via_2. For example, various conductive lines in the metal layer level M3 are disposed over various vias in the via level via_2. In some embodiments, the conductive lines 355_1 and 355_2 are parallel to the Y-direction.

The via 250_1 is connected between the conductive lines 345_2 and 355_1, so as to electrically connect the source/drain contact (e.g., 220_1 of FIG. 3C) of the pull-down transistor PD-2 to the ground line CVss. Furthermore, the via 250_2 is connected between the conductive lines 345_3 and 355_2, so as to electrically connect the source/drain contact (e.g., 220_8 of FIG. 3C) of the pull-down transistor PD-1 to the ground line CVss. The conductive lines 355_1 and 355_2 may further extend into and be shared by the neighboring memory cells 30 in the different columns and/or rows. In some embodiments, the conductive lines 355_1 and 355_2 are coupled to the ground line CVss through the upper layers over the third metal layer M3.

In such embodiments, the conductive lines 335_1 through 335_7 of the first metal layer M1, the conductive lines 345_1 through 345_3 of the second metal layer M2, and the conductive lines 355_1 through 355_2 of the third metal layer M3 are made of the same material, and the material is selected from a group consisting of Ti, TiN, TaN, Co, Ru, Pt, W, Al, Cu, or a combination thereof.

In FIG. 3D, the gate electrodes 210_1 through 210_4 are parallel to the conductive line 345_1 (i.e., the word line WL), e.g., the X-direction. Furthermore, the conductive line 335_3 (i.e., the complementary bit line BLB), the conductive line 335_4 (i.e., the power line CVdd), the conductive line 335_5 (i.e., the bit line BL), and the conductive lines 355_1 and 355_2 (CVss) are parallel to the same direction, e.g., the Y-direction.

In some embodiments, the conductive line 345_1 is further coupled to the word line WL in the fourth metal layer M4 over the third metal layer M3 through a via level via_3.

Figure 4A:
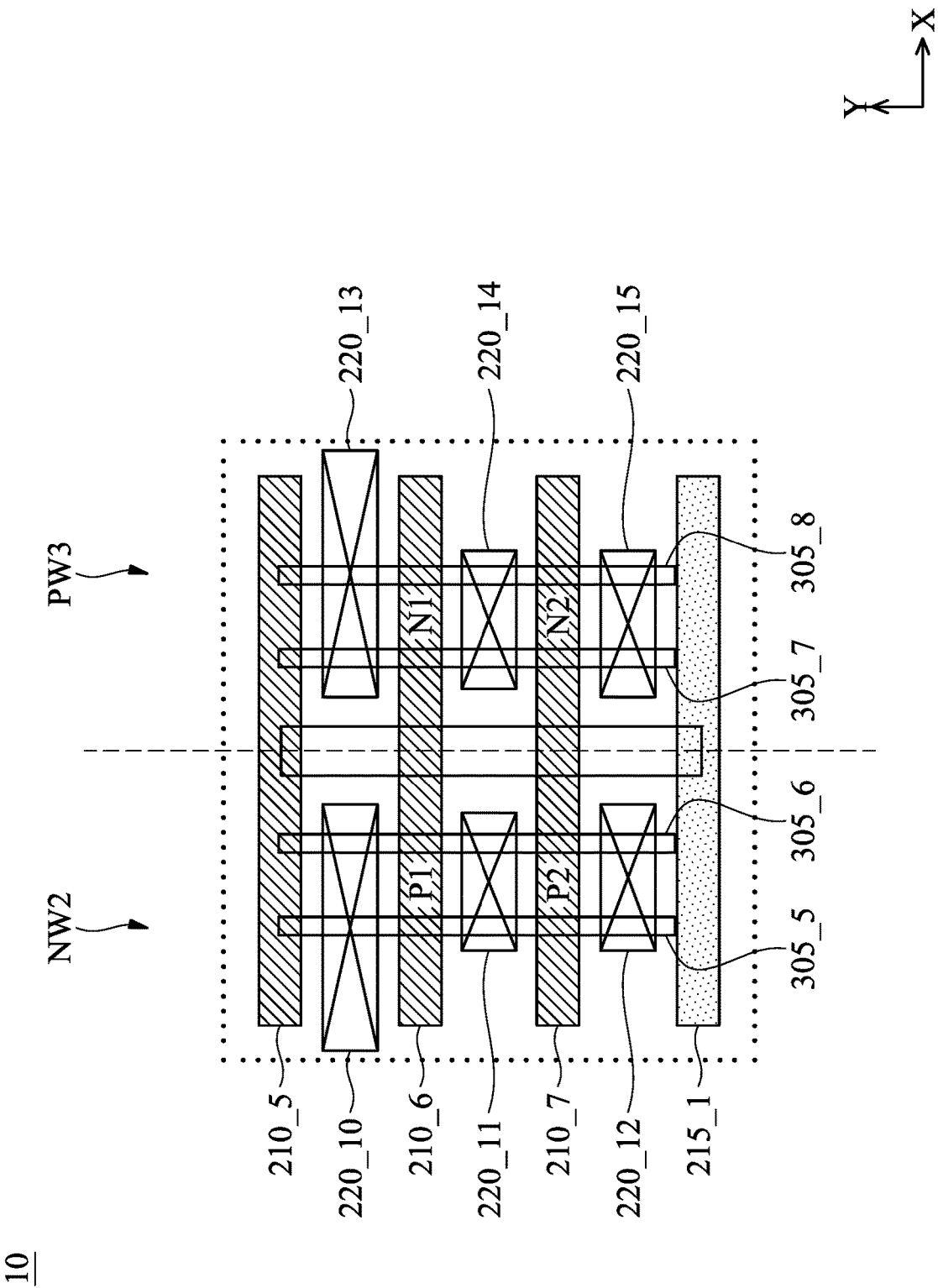
FIGS. 4A and 4B illustrate block diagrams of a layout of features of the logic cell, in accordance with some embodiments of the disclosure.
Figure 4B:
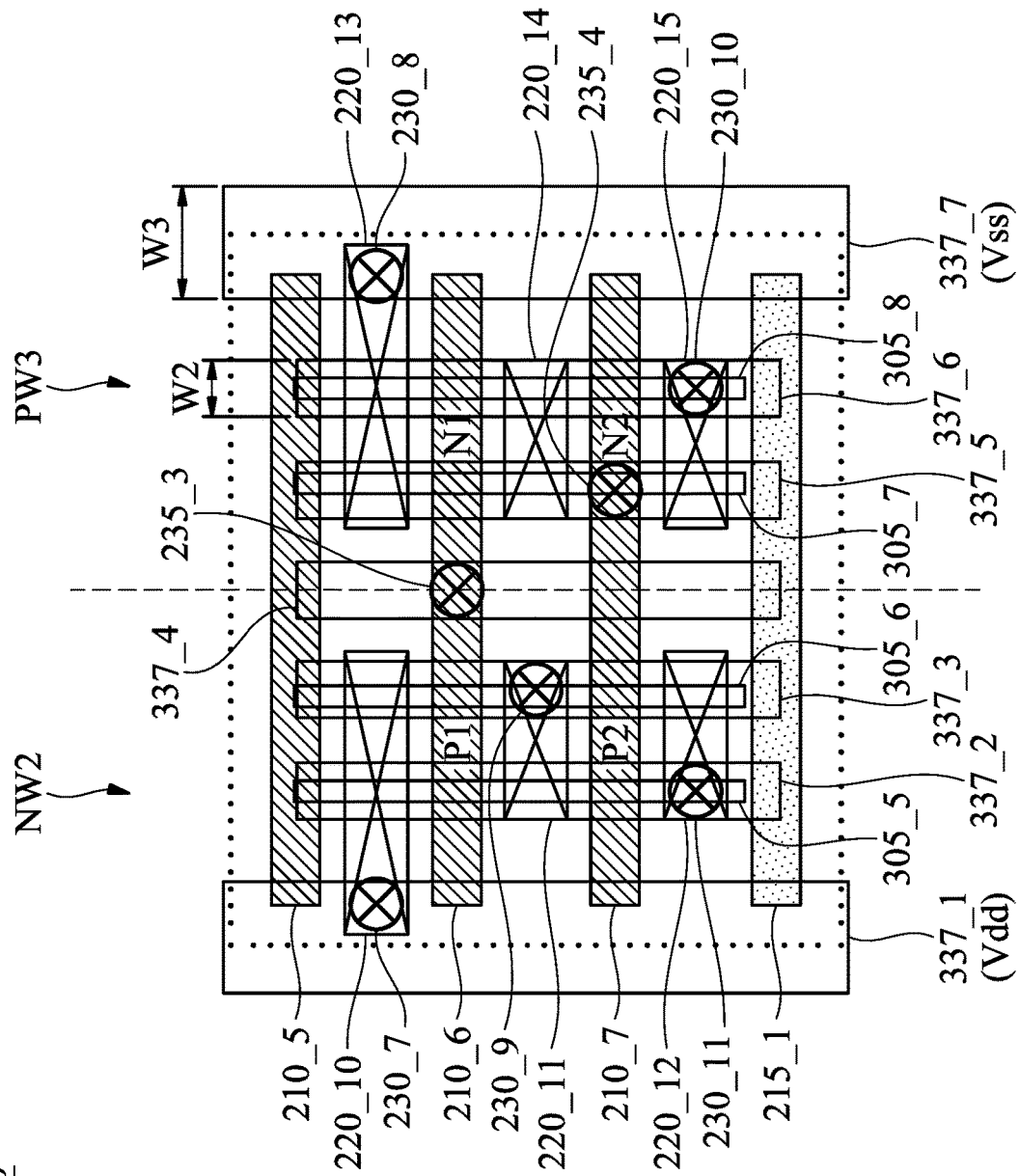

FIGS. 4A and 4B illustrate block diagrams of a layout of features of the logic cell 10, in accordance with some embodiments of the disclosure. FIGS. 4A and 4B illustrate features in different levels of the logic cell 10. As described above, the logic cell 10 may be a standard cell (STD cell) formed by the PMOS transistors P1 and P2, and the NMOS transistors N1 and N2. For example, the logic cells 10 may be the standard cells corresponding to the same logic gates (e.g., (e.g., inverter (INV), AND, OR, NAND, NOR, Flip-Flop, SCAN, etc.) or different logic gates. Furthermore, an outer boundary of the logic cell 10 is illustrated using dashed lines.

FIG. 4A shows features of the logic cell 10 in a contact level and lower. In FIG. 4A, a gate electrode 210_6 forms the PMOS transistor P1 with an underlying active regions 305_5 and 306_6 in the N-type well region NW2. In some embodiments, each of the active regions 305_5 and 306_6 is fin-based and includes one fin structure disposed under the gate electrode 210_6 (e.g., the gate electrode 210_6 may be disposed over and extend along sidewalls of the active regions 305_5 and 305_6). Furthermore, the active regions 305_5 and 305_6 below the gate electrode 210_6 form the channel region of the PMOS transistor P1. The gate electrode 210_6 further forms the NMOS transistor N1 with the underlying active regions 305_7 and 305_8 in P-type well region PW3. In other words, the gate electrode 210_6 is shared by the PMOS transistor P1 and the NMOS transistor N1. In some embodiments, each of the active regions 305_7 and 305_8 is fin-based and includes one fin structure disposed under the gate electrode 210_6. Furthermore, the active regions 305_7 and 305_8 below the gate electrode 210_6 form the channel region of the NMOS transistor N1.

A gate electrode 210_7 forms the PMOS transistor P2 with the underlying active regions 305_5 and 306_6 in the N-type well region NW2. In some embodiments, each of the active regions 305_5 and 306_6 is fin-based and includes one fin structure disposed under the gate electrode 210_7 (e.g., the gate electrode 210_7 may be disposed over and extend along sidewalls of the active regions 305_5 and 305_6). Furthermore, the active regions 305_5 and 305_6 below the gate electrode 210_7 form the channel region of the PMOS transistor P2. The gate electrode 210_7 further forms the NMOS transistor N2 with the underlying active regions 305_7 and 305_8 in P-type well region PW3. In other words, the gate electrode 210_7 is shared by the PMOS transistor P2 and the NMOS transistor N2. In some embodiments, each of the active regions 305_7 and 305_8 is fin-based and includes one fin structure disposed under the gate electrode 210_7. Furthermore, the active regions 305_7 and 305_8 below the gate electrode 210_7 form the channel region of the NMOS transistor N2.

In FIG. 4A, each of the active regions 305_5 through 305_8 includes a single fin. In some embodiments, there may be a single fin, two fins, three fins, or more for the active regions 305_5 through 305_8. Furthermore, the number of fins in the active regions 305_5 through 305_8 may be the same as or different than other active regions in the logic cell 10.

The contact level may include the source/drain contacts (also referred to as "contact") for connecting the source/drain regions of transistors (e.g., P1, P2, N1 and N2) to the overlying level. In some embodiments, the contact level may further include the gate contacts (also referred to as contact plugs) for connecting the gate electrodes of the transistors (e.g., P1, P2, N1 and N2) to an overlying level.

In FIG. 4A, each of the source/drain contacts 220_10 through 220_15 is a longer contact, and is elongated and has a longitudinal direction in the X-direction, which is parallel to the extending directions of the gate electrodes 210_6 and 210_7. Each of the source/drain contacts 220_10 through 220_15 has a rectangular shape which has a longer side along the X-direction and a shorter side along the Y-direction.

The source/drain contacts 220_10 and 220_11 are used to connect the source and drain regions of the PMOS transistor P1. The source/drain contacts 220_11 and 220_12 are used to connect the source and drain regions of the PMOS transistor P2. Furthermore, the source/drain contacts 220_13 and 220_14 are used to connect the source and drain regions of the NMOS transistor N1. The source/drain contacts 220_14 and 220_15 are used to connect the source and drain regions of the NMOS transistor N2.

In some embodiments, the gate electrode 210_5 and the dielectric-base gate 215_1 are a dummy gates. The gate electrodes 210_6 and 210_7 are arranged between the dielectric-base dummy gate 215_1 and the gate electrode 210_5. In some embodiments, the dielectric-base dummy gate 215_1 is capable of providing fin broken for isolation.

FIG. 4B shows features of the logic cell 10 in a metal layer level M1 (not shown), a via level via_0 (not shown) and lower. The vias 230_7 through 230_11, and the gate vias 235_3 and 235_4 are disposed in the via level via_0. Furthermore, the conductive lines 337_1 through 337_7 are disposed in the metal layer level M1 over the via level via_0. For example, various conductive lines in the metal layer level M1 are disposed over various vias in the via level via_0. In some embodiments, the conductive lines 337_1 through 337_7 are parallel to the Y-direction.

The gate vias 235_3 and 235_4 are connected to the gate electrodes 210_6 and 210_7. The gate via 235_3 is further connected to the conductive line 337_4 which may be used to electrically couple the gate electrodes of the PMOS transistor P1 and the NMOS transistor N1 to the upper layer. The gate via 235_4 is further connected to the conductive line 337_5 which may be used to electrically couple the gate electrodes of the PMOS transistor P2 and the NMOS transistor N2 to the upper layer.

Furthermore, the vias 230_7, 230_9 and 230_11 are connected to the source/drain contacts 220_10, 220_11 and 220_12, respectively. The via 230_7 is further connected to the conductive line 337_1. In such embodiments, the conductive line 337_1 functions as a power line Vdd, and the via 230_7 is electrically couple the drain of the PMOS transistor P1 to the power line Vdd. The via 230_9 is further connected to the conductive line 337_3, and the via 230_9 may be used to electrically couple the source/drain of the PMOS transistors P1 and P2 to the upper layer. Moreover, the via 230_11 is further connected to the conductive line 337_2, and the via 230_11 may be used to electrically couple the source/drain of the PMOS transistor P2 to the upper layer.

In FIG. 4B, the vias 230_8 and 230_10 are connected to the source/drain contacts 220_13 and 220_15, respectively. The via 230_8 is further connected to the conductive line 337_7. In such embodiments, the conductive line 337_7 functions as a ground line Vss, and the via 230_8 is electrically couple the source of the NMOS transistor N1 to the ground line Vss. The via 230_10 is further connected to the conductive line 337_6, and the via 230_10 may be used to electrically couple the source/drain of the NMOS transistor N2 to the upper layer.

In some embodiments, the conductive lines 337_1 and 337_7 have a width W3. In some embodiments, the conductive lines 337_2 through 337_6 are local interconnection lines for the logic cell 10. In other words, the conductive lines 337_2 through 337_6 are not shared by the other logic cell 10. Furthermore, the conductive lines 337_2 through 337_6 have the same width W2 which is narrower than the conductive lines 337_1 and 337_7, i.e., W3>W2.

In some embodiments, the ratio of the width W1 of the conductive lines 335_3 and 335_5 in the memory cell 30 and the width W2 of the conductive lines 337_2 through 337_6 in the logic cell 10 is within a range from about 1.5 to about 4. Furthermore, in the logic cell 10, the ratio of the width W3 of the conductive lines 337_1 and 337_7 and the width W2 of the conductive lines 337_2 through 337_6 is within a range from about 1.5 to about 6.

Figure 5:
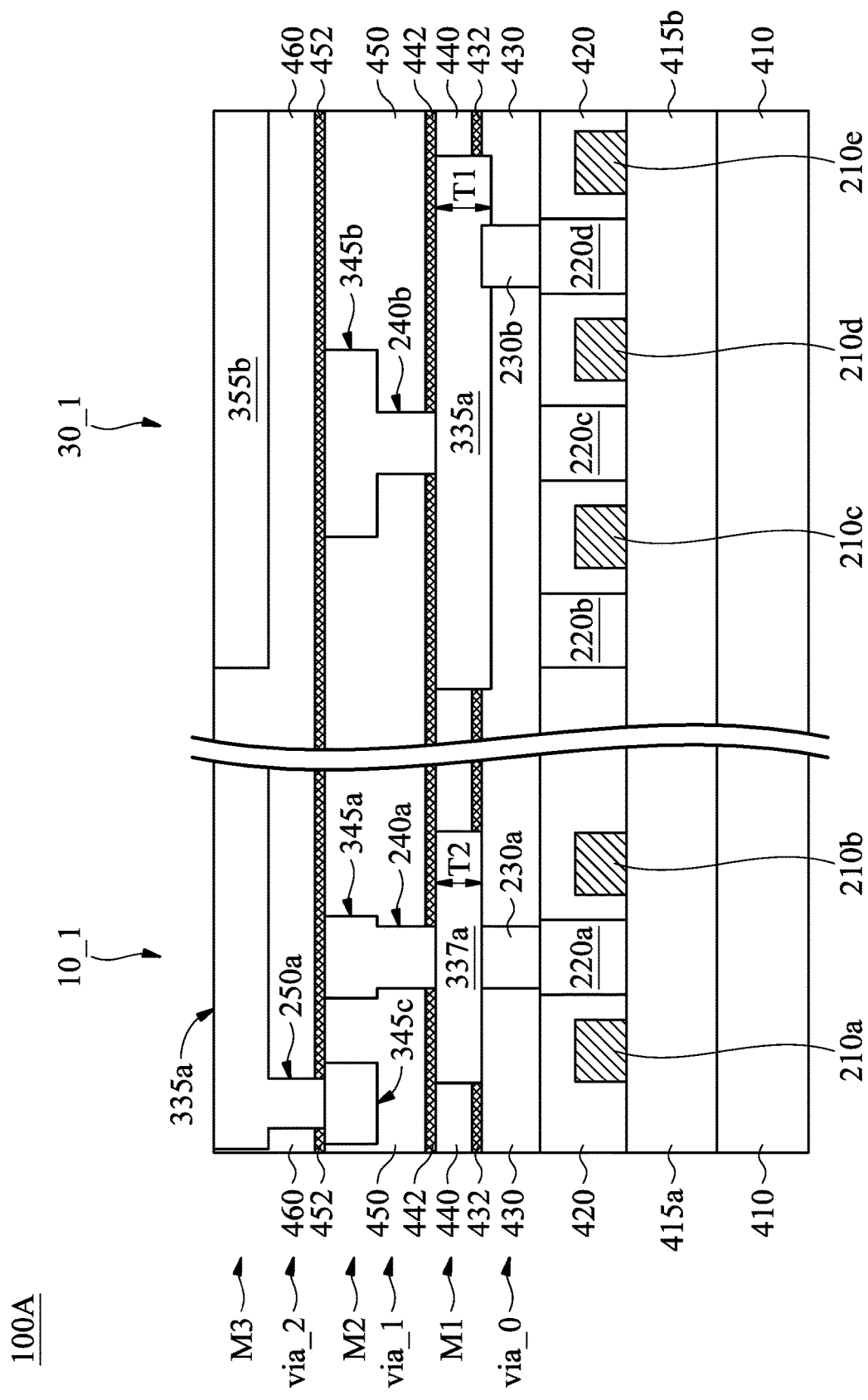
FIG. 5 illustrates a cross-sectional view of the semiconductor structure of an IC 100A, in accordance with some embodiments of the disclosure.

FIG. 5 illustrates a cross-sectional view of the semiconductor structure of an IC 100A, in accordance with some embodiments of the disclosure. The IC 100A includes multiple logic cells 10_1 formed a circuit (e.g., 110 of FIG. 1) and multiple memory cells 30_1 formed a memory (e.g., 130 of FIG. 1).

In the logic cell 10_1, a well region 415a is formed over the substrate 410, and the gate electrodes 210a and 210b and the contact 220a are formed over the well region 415a. In some embodiments, the well region 415a is a P-type well region, and the gate electrodes 210a and 210b are coupled to the gate regions of NMOS transistors (e.g., N1 and N2 of FIGS. 4A and 4B) in the logic cell 10_1. Furthermore, the contact 220a is coupled to the source/drain regions of NMOS transistors in the logic cell 10_1. In some embodiments, the well region 415a is an N-type well region, and the gate electrodes 210a and 210b are coupled to the gate regions of PMOS transistors (e.g., P1 and P2 of FIGS. 4A and 4B) in the logic cell 10_1. Furthermore, the contact 220a is coupled to the source/drain region of PMOS transistor in the logic cell 10_1.

The source/drain contact 220_a and the gate electrodes 210a and 210b are formed in an isolation layer 420. In some embodiments, the isolation layer 420 is an Inter-Layer Dielectric (ILD) layer 420. The isolation layer 420 is formed over the well regions 415a and 415b. In some embodiments, the isolation layer 420 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

An isolation layer 430 is formed over the isolation layer 420. In some embodiments, the isolation layer 430 is an inter-metallization dielectric (IMD) layer. The via 230a is disposed in the via level via_0 and formed in the isolation layer 430. The via 230a is electrically connected to the source/drain contact 220a.

An etching stop layer 432 and an isolation layer 440 are formed on the isolation layer 430. In some embodiments, the isolation layer 440 is an IMD layer. The conductive line 337a is disposed in the metal layer level M1 and formed in the isolation layer 440. The conductive line 337a is electrically connected to the via 230a.

In some embodiments, the thickness (or height) T2 of the conductive line 337a is equal to the sum of the height of the etching stop layer 432 and the height of the isolation layer 440. In other words, the top surface of the conductive line 337a and the top surface of the isolation layer 440 are coplanar, and the bottom surface of the conductive line 337a and the bottom surface of the etching stop layer 432 are coplanar.

In some embodiments, the isolation layer 440 may be formed of a material that is selected from a group consisting of $SiO_2$, Low-K dielectric (K<3.9), Carbon-doped silicon dioxide, Fluorine-doped silicon dioxide, or a combination thereof. Furthermore, the etching stop layer 432 may be formed of a material that is selected from a group consisting of $Al_2O_3$, $Si_3N_4$, SiCN, SiOCN, Al content dielectric, metal content dielectric, Nitrogen content dielectric, Carbon content dielectric, or a combination thereof.

In some embodiments, the conductive line 337a and the via 230a are formed in a single damascene process, and the conductive line 337a and the via 230a are made of the different materials. In some embodiments, the conductive line 337a includes a Cu-based material, and the via 230a includes a W-based material.

An etching stop layer 442/442a and an isolation layer 450 are formed on the isolation layer 440. In some embodiments, the isolation layer 450 is an IMD layer. The conductive lines 345a and 345c are disposed in the metal layer level M2 and formed in the isolation layer 450. The via 240a is disposed in the via level via_1 and formed in the isolation layer 450. The conductive line 345a is electrically connected to the conductive line 337a through the via 240a.

In some embodiments, the isolation layer 450 may be formed of a material that is selected from a group consisting of $SiO_2$, Low-K dielectric (K<3.9), Carbon-doped silicon dioxide, Fluorine-doped silicon dioxide, or a combination thereof. Furthermore, the etching stop layer 442/442a may be formed of a material that is selected from a group consisting of $Al_2O_3$, $Si_3N_4$, SiCN, SiOCN, Al content dielectric, metal content dielectric, Nitrogen content dielectric, Carbon content dielectric, or a combination thereof.

In some embodiments, the conductive line 345a and the via 240a are formed in a dual damascene process. Furthermore, the conductive line 345a and the via 240a are made of the same material, and the material is selected from a group consisting of Ti, TiN, TaN, Co, Ru, Pt, W, Al, Cu, or a combination thereof.

An etching stop layer 452 and an isolation layer 460 are formed on the isolation layer 450. In some embodiments, the isolation layer 460 is an IMD layer. The conductive line 355a is disposed in the metal layer level M3 and formed in the isolation layer 460, and the via 250a is disposed in the via level via_2 and formed in the isolation layer 460. The conductive line 355a is electrically connected to the conductive line 345c through the via 250a.

In some embodiments, the isolation layer 460 may be formed of a material that is selected from a group consisting of $SiO_2$, Low-K dielectric (K<3.9), Carbon-doped silicon dioxide, Fluorine-doped silicon dioxide, or a combination thereof. Furthermore, the etching stop layer 452 may be formed of a material that is selected from a group consisting of $Al_2O_3$, $Si_3N_4$, SiCN, SiOCN, Al content dielectric, metal content dielectric, Nitrogen content dielectric, Carbon content dielectric, or a combination thereof.

In some embodiments, the conductive line 355a and the via 250a are formed in a dual damascene process. Furthermore, the conductive line 355a and the via 250a are made of the same material, and the material is selected from a group consisting of Ti, TiN, TaN, Co, Ru, Pt, W, Al, Cu, or a combination thereof.

In the memory cell 30_1, the well region 415b is formed over the substrate 410. In some embodiments, the well region 415b is a P-type well region, and the gate electrodes 210c through 210e are coupled to the gate regions of N-type transistors (e.g., the pass-gate transistors PG-2 and PG-1 and the pull-down transistors PD-2 and PD-1) in the memory cell 30_1. In some embodiments, the well region 415b is an N-type well region, and the gate electrodes 210c through 210e are coupled to the gate regions of P-type transistors (e.g., the pull-up transistors PU-2 and PU-1) in the memory cell 30_1.

The source/drain contacts 220b through 220d and the gate electrodes 210c through 210e are positioned over the well region 415b, and are formed in the isolation layer 420.

The via 230b is disposed in the via level via_0 and formed in the isolation layer 430. The via 230b is electrically connected to the source/drain contact 220d. Furthermore, the source/drain contact 220d is coupled to the source/drain region of transistor (e.g., PG-1, PG-2, PD-1, PD-2, PU-1 and PU-2) in the memory cell 30_1.

The conductive line 335a is disposed in the metal layer level M1 and formed in the isolation layer 440. The conductive line 335a is electrically connected to the via 230b. In some embodiments, the thickness (or height) T1 of the conductive line 335a is greater than the sum of the height of the etching stop layer 432 and the height of the isolation layer 440. In other words, the bottom surface of the conductive line 335a is lower than the top surface of the isolation layer 430 and the bottom surface of the etching stop layer 432. Furthermore, the top surface of the via 230b is higher than the bottom surface of the conductive line 335a. Therefore, the top surface and a portion of side surface of the 230b are in contact with the conductive line 335a.

Compared with the logic cell 10_1, the thickness T1 of the conductive line 335a of the memory cell 30_1 is greater than the thickness T2 of the conductive line 337a of the logic cell 10_1 in the first layer level M1 of the IC 100A, i.e., T1>T2. In other words, the conductive line 335a is thicker than the conductive line 337a. In some embodiments, the ratio of the thickness T1 of the conductive line 335a in the memory cell 30_1 and the thickness T2 of the conductive line 337a in the logic cell 10_1 is within a range from about 1.1 to about 1.5. Furthermore, the vias 230a and 230b are the same height. Furthermore, a contact area between the conductive line 335a and the via 230b in the memory cell 30_1 is greater than a contact area between the conductive line 337a and the via 230a of the logic cell 10_1.

In some embodiments, all of the conductive lines in the metal layer level M1 of the memory cell 30_1 have the same thickness T1. For example, the conductive line 335a with the thickness T1 functions as the complementary bit line BLB (e.g., 335_3 of FIG. 3D), the bit line BL (e.g., 335_5 of FIG. 3D), and the power lines CVdd (e.g., 335_4 of FIG. 3D). Furthermore, the remaining conductive lines in the metal layer level M1 of the memory cell 30_1 also have the thickness T1, e.g., landing pads 335_1, 335_2, 335_6 and 335_7 of FIG. 3D.

In some embodiments, the conductive lines corresponding to the complementary bit line BLB, the bit line BL and the power lines CVdd in the metal layer level M1 of the memory cell 30_1 have the thickness T1, e.g., the conductive lines 335_3 through 335_5 of FIG. 3D. Furthermore, the remaining conductive lines in the metal layer level M1 of the memory cell 30_1 have the thickness T2, e.g., landing pads 337_1, 337_2, 337_6 and 337_7 of FIG. 3D.

In some embodiments, the conductive line 335a and the via 230b are formed in a single damascene process, and the conductive line 335a and the via 230b are made of the different materials. In some embodiments, the conductive line 335a includes a Cu-based material, and the via 230b includes a W-based material.

In some embodiments, the deeper trench depth for the conductive line 335a of the memory cell 30_1 is formed by additional processing steps, such as lithography and etching processes. For example, the etching stop layer 432 and the isolation layer 440 are formed by deposition processes. Next, a first patterning process is performed on the etching stop layer 432 and the isolation layer 440 to form the trenches corresponding to the thickness T2. Next, a second patterning process is performed on the isolation layer 430 to form the trenches corresponding to the thickness T1. Each of the first and second patterning processes includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The conductive line 345b is disposed in the metal layer level M2 and formed in the isolation layer 450, and the via 240b is disposed in the via level via_1 and formed in the isolation layer 450. The conductive line 345b is electrically connected to the conductive line 335a through the via 240b.

In some embodiments, the conductive line 345b and the via 240b are formed in a dual damascene process, and the conductive line 345b and the via 240b are made of the same material, and the material is selected from a group consisting of Ti, TiN, TaN, Co, Ru, Pt, W, Al, Cu, or a combination thereof.

The conductive line 355b is disposed in the metal layer level M3 and formed in the isolation layer 460. As described above, the conductive line 355b and the corresponding via in the via level via_2 (not shown) are formed in a dual damascene process.

In the logic cell 10_1 of the IC 100A, the conductive lines with the thickness T2 have tighten metal pitch and thinner thickness for routing density and capacitance reduction in the metal layer level M1. In the memory cell 30_1 of the IC 100A, the conductive lines with the thickness T1 have lower line resistance to improve write-cycle Vcc_min performance for the memory (e.g., SRAM). In other words, the memory cell 30_1 has less IR drop in the bit line BL and complementary bit line BLB during the write cycle in the write margin. Thus, high resistance concerns on bit line BL and the complementary bit line BLB of the memory cell are solved. Furthermore, the contact area between the conductive line 335a and the via 230b is increased, thereby decreasing landing resistance for the conductive line 335a.

By using the conductive lines with the thicker thickness (e.g., the thickness T1) in the metal layer level M1 that function as the complementary bit line BLB and the bit line BL, the resistances of the complementary bit line BLB and the bit line BL are decreased in the memory cell 30. Therefore, when metal thickness and line width are continuously reduced, the memory cell 30 does not exhibit high resistance, and hence the cell speed and voltage (e.g., V_min) performance of the memory cell 30 is not impacted. Furthermore, the memory array formed by the memory cells 30 has less IR drop in the bit line BL and complementary bit line BLB during the write cycle in the write margin. Furthermore, the memory array formed by the memory cells 30 also has low line resistance in the bit line BL and complementary bit line BLB for RC delay reduction. Thus, array efficiency and speed are increased in the memory array.

Figure 6:
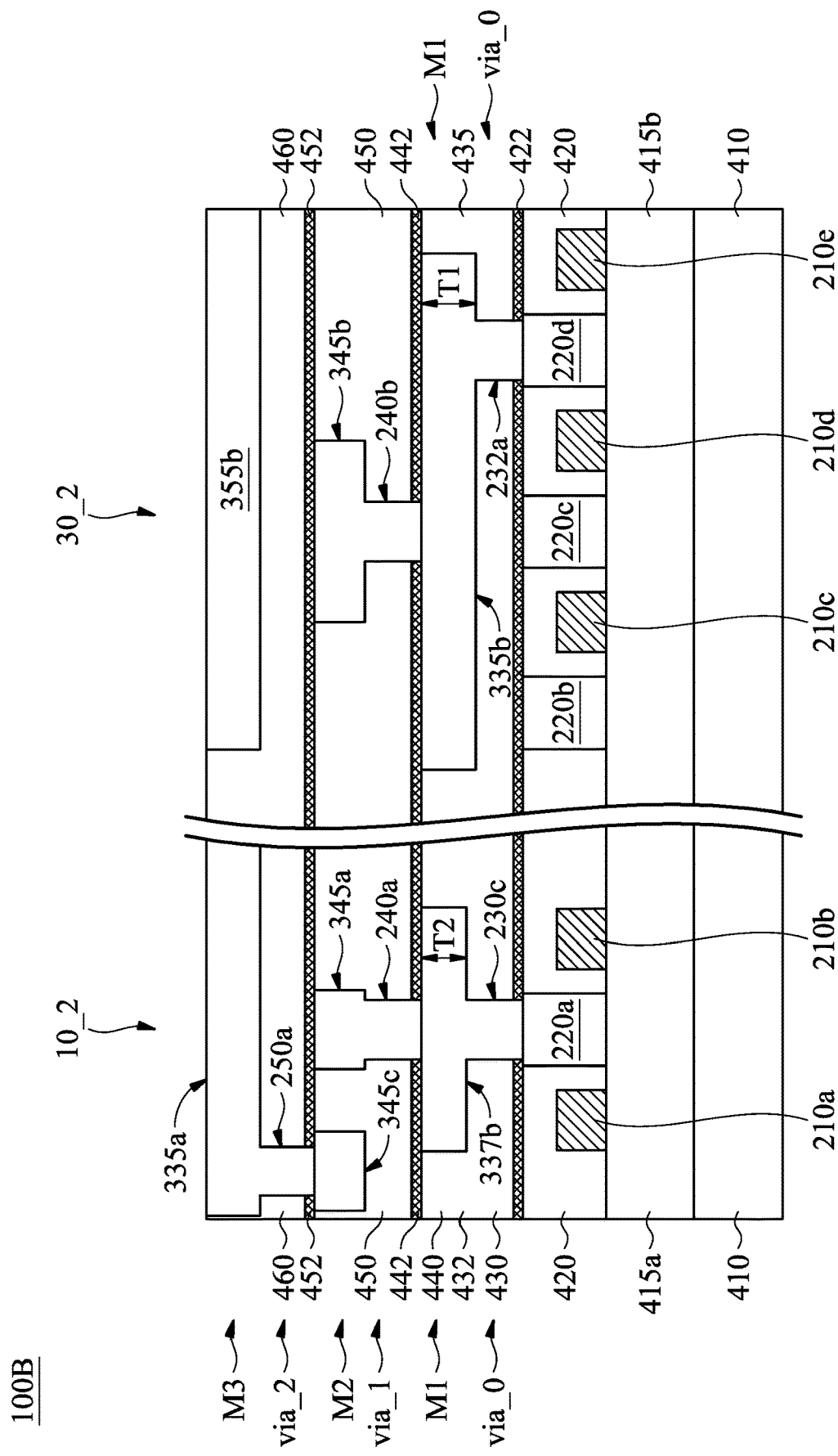
FIG. 6 illustrates a cross-sectional view of the semiconductor structure of an IC, in accordance with some embodiments of the disclosure.

FIG. 6 illustrates a cross-sectional view of the semiconductor structure of an IC 100B, in accordance with some embodiments of the disclosure. The IC 100B includes multiple logic cells 10_2 formed a circuit (e.g., 110 of FIG. 1) and multiple memory cells 30_2 formed a memory (e.g., 130 of FIG. 1). The semiconductor structure of the IC 100B in FIG. 6 is similar to the semiconductor structure of the IC 100A in FIG. 5, the difference between FIG. 5 and FIG. 6 is that an etching stop layer 422 and an isolation layer 435 are formed on the isolation layer 420. In some embodiments, the isolation layer 435 is an IMD layer.

In some embodiments, the isolation layer 435 may be formed of a material that is selected from a group consisting of $SiO_2$, Low-K dielectric (K<3.9), Carbon-doped silicon dioxide, Fluorine-doped silicon dioxide, or a combination thereof. Furthermore, the etching stop layer 422 may be formed of a material that is selected from a group consisting of $Al_2O_3$, $Si_3N_4$, SiCN, SiOCN, Al content dielectric, metal content dielectric, Nitrogen content dielectric, Carbon content dielectric, or a combination thereof.

In the logic cell 10_2, the conductive lines 337b is disposed in the metal layer level M1 and formed in the isolation layer 435, and the via 230c is disposed in the via level via_1 and formed in the isolation layer 435. The conductive line 337b is electrically connected to the contact 220a through the via 230c, and the conductive line 345a is electrically connected to the conductive line 337b through the via 240a.

In the memory cell 30_2, the conductive lines 335b is disposed in the metal layer level M1 and formed in the isolation layer 435, and the via 232a is disposed in the via level via_1 and formed in the isolation layer 435. The conductive line 335b is electrically connected to the conduct 220d through the via 232a, and the conductive line 345b is electrically connected to the conductive line 335b through the via 240b.

In some embodiments, the conductive lines 337b and 335b and the vias 230c and 232a are formed in a dual damascene process, and the conductive lines 337b and 335b and the vias 230c and 232a are made of the same material, and the material is selected from a group consisting of Ti, TiN, TaN, Co, Ru, Pt, W, Al, Cu, or a combination thereof.

In FIG. 6, the conductive line 337b has thickness T2, and the conductive line 335b has thickness T2. Furthermore, the height of the via 230c is greater than the height of the via 232a. Moreover, the sum of the thickness T2 of the conductive line 337b and the height of the via 230c is equal to the sum of the thickness T1 of the conductive line 335b and the height of the via 232a.

In some embodiments, the deeper trench depth for the conductive line 335b of the memory cell 30_2 is formed by additional processing steps, such as lithography and etching processes. For example, the etching stop layer 422 and the isolation layer 435 are formed by deposition processes.

Next, a first patterning process is performed on the isolation layer 435 to form the trenches corresponding to the thickness T2. Next, a second patterning process is performed on the isolation layer 435 to form the trenches corresponding to the thickness T1. Each of the first and second patterning processes includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

As described above, the conductive line 337b of the logic cell 10_2 with the thickness T2 has tighten metal pitch and thinner thickness for routing density and capacitance reduction in the metal layer level M1. In the memory cell 30_2 of the IC 100B, the conductive line 335b with the thickness T1 has lower line resistance to improve write-cycle Vcc_min performance for SRAM. In other words, the memory cell 30_2 has less IR drop in the bit line BL and complementary bit line BLB during the write cycle in the write margin. Thus, high resistance concerns on bit line BL and the complementary bit line BLB of the SRAM are solved.

Figure 7:
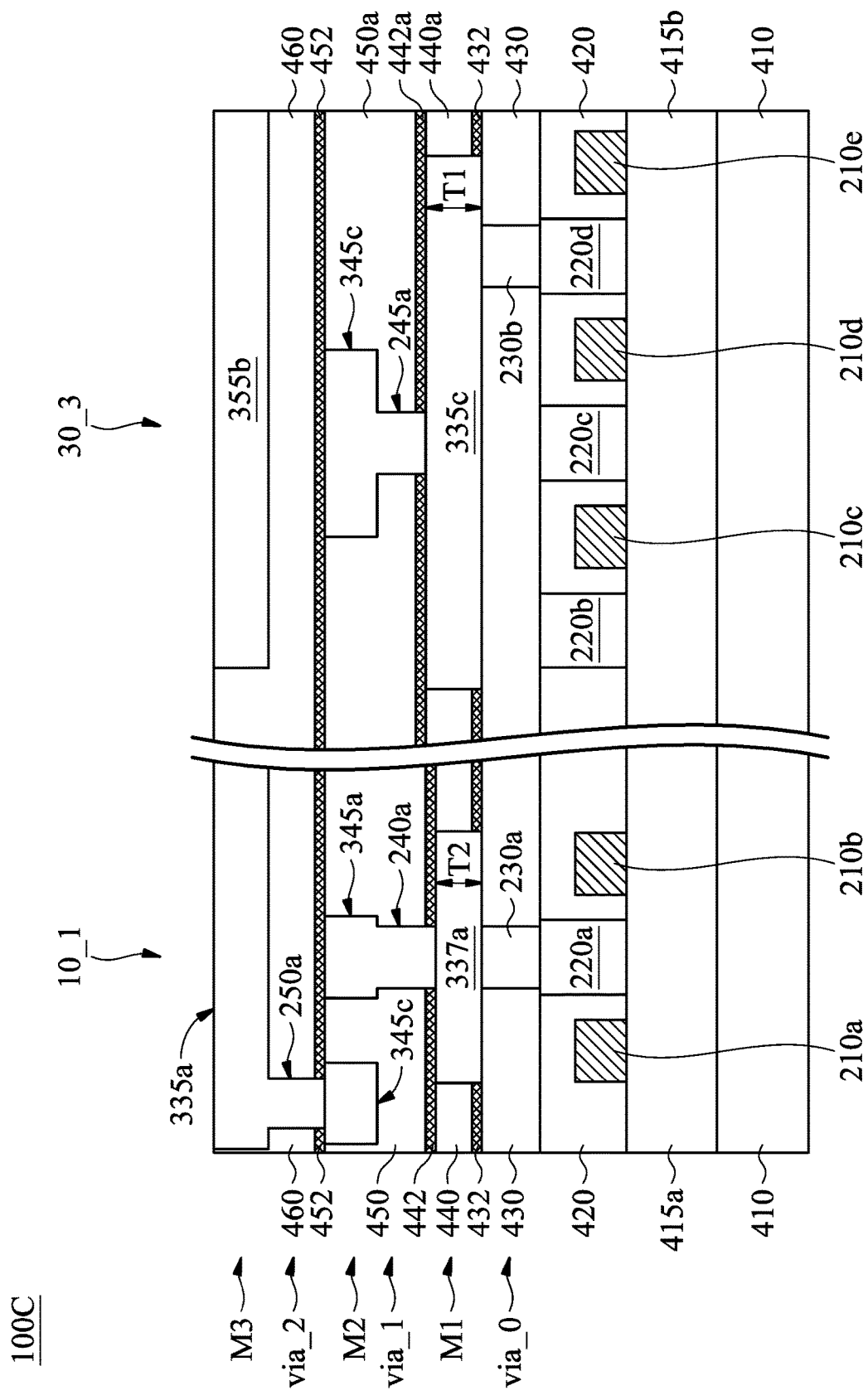
FIG. 7 illustrates a cross-sectional view of the semiconductor structure of an IC, in accordance with some embodiments of the disclosure.

FIG. 7 illustrates a cross-sectional view of the semiconductor structure of an IC 100C, in accordance with some embodiments of the disclosure. The IC 100C includes multiple logic cells 10_1 formed a circuit (e.g., 110 of FIG. 1) and multiple memory cells 30_3 formed a memory (e.g., 130 of FIG. 1). The logic cell 10_1 has been described in FIG. 5 and will be omitted.

The configuration below the isolation layer 430 of the semiconductor structure of the IC 100C in FIG. 7 is similar to that of the semiconductor structure of the IC 100A in FIG. 5.

In the memory cell 30_3, the via 230b is disposed in the via level via_0 and formed in the isolation layer 430. The via 230b is electrically connected to the source/drain contact 220d. Furthermore, the source/drain contact 220d is coupled to the source/drain region of transistor (e.g., PG-1, PG-2, PD-1, PD-2, PU-1 and PU-2) in the memory cell 30_1. Furthermore, the via 230a of the logic cell 10_1 and 230b of the memory cell 30_3 are the same height.

An etching stop layer 432 and an isolation layer 440a are formed on the isolation layer 430. In some embodiments, the isolation layer 440a is an IMD layer. In some embodiments, the isolation layer 440 of the logic cell 10_1 and the isolation layer 440a of the memory cell 30_3 are formed by the same processing steps, and the height of the isolation layer 440a is greater than the height of the isolation layer 440.

The conductive line 335c is disposed in the metal layer level M1 and formed in the isolation layer 440a. The conductive line 335c is electrically connected to the via 230b.

In some embodiments, the bottom surface of the conductive line 337a and the bottom surface of the conductive line 335c are coplanar. Thus, the contact area between the conductive line 337a and the via 230a is determined according to the top surface of the via 230a, and the contact area between the conductive line 335c and the via 230b is determined according to the top surface of the via 230b. In some embodiments, the contact area between the conductive line 337a and the via 230a is equal to the contact area between the conductive line 335c and the via 230b.

In some embodiments, the thickness (or height) T1 of the conductive line 335c is greater than the sum of the height of the etching stop layer 432 and the height of the isolation layer 440. Compared with the logic cell 10_1, the thickness T1 of the conductive line 335c of the memory cell 30_3 is greater than the thickness T2 of the conductive line 337a of the logic cell 10_1 in the first layer level M1 of the IC 100C, i.e., T1>T2. In other words, the conductive line 335c is thicker than the conductive line 337a. In some embodiments, the ratio of the thickness T1 of the conductive line 335c in the memory cell 30_3 and the thickness T2 of the conductive line 337a in the logic cell 10_1 is within a range from about 1.1 to about 1.5.

In some embodiments, all of the conductive lines in the metal layer level M1 of the memory cell 30_3 have the same thickness T1. For example, the conductive line 335c with the thickness T1 functions as the complementary bit line BLB (e.g., 335_3 of FIG. 3D), the bit line BL (e.g., 335_5 of FIG. 3D), and the power lines CVdd (e.g., 335_4 of FIG. 3D). Furthermore, the remaining conductive lines in the metal layer level M1 of the memory cell 30_3 also have the thickness T1, e.g., landing pads 335_1, 335_2, 335_6 and 335_7 of FIG. 3D.

In some embodiments, the conductive lines corresponding to the complementary bit line BLB, the bit line BL and the power lines CVdd in the metal layer level M1 of the memory cell 30_3 have the thickness T1, e.g., the conductive lines 335_3 through 335_5 of FIG. 3D. Furthermore, the remaining conductive lines in the metal layer level M1 of the memory cell 30_3 have the thickness T2, e.g., landing pads 337_1, 337_2, 337_7 and 337_8 of FIG. 3D.

In some embodiments, the conductive line 335c and the via 230b are formed in a single damascene process, and the conductive line 335c and the via 230b are made of the different materials. In some embodiments, the conductive line 335c includes a Cu-based material, and the via 230b includes a W-based material.

In some embodiments, the deeper trench depth for the conductive line 335c of the memory cell 30_3 is formed by additional processing steps, such as lithography and etching processes. For example, the etching stop layer 432 and the isolation layer 440/440a are formed by deposition processes, and the isolation layers 440 and 440a are the same height. Next, additional lithography and etching processes are performed on the isolation layer 440, so as to thin down the isolation layer 440. Thus, the height of the isolation layer 440 is less than the height of the isolation layer 440a. Next, a patterning process is performed on the etching stop layer 432 and the isolation layer 440/440a to form the trenches corresponding to the thickness T2/T1. The patterning processes include a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

In the memory 30_3, the conductive line 345c is disposed in the metal layer level M2 and formed in the isolation layer 450a, and the via 245a is disposed in the via level via_1 and formed in the isolation layer 450a. The conductive line 345c is electrically connected to the conductive line 335c through the via 245a.

In some embodiments, the height of the isolation layer 450 of the logic cell 10_1 is greater than the height of the isolation layer 450a of the memory cell 30_3. Due to the thickness of the conductive line 345a is the same as the thickness of the conductive line 345c, the height of the via 240a is greater than the height of the 245a.

In some embodiments, the conductive line 345c and the via 245a are formed in a dual damascene process, and the conductive line 345b and the via 245a are made of the same material, and the material is selected from a group consisting of Ti, TiN, TaN, Co, Ru, Pt, W, Al, Cu, or a combination thereof.

The conductive line 355b is disposed in the metal layer level M3 and formed in the isolation layer 460. As described above, the conductive line 355b and the corresponding via in the via level via_2 (not shown) are formed in a dual damascene process.

In the logic cell 10_1 of the IC 100C, the conductive lines with the thickness T2 have tighten metal pitch and thinner thickness for routing density and capacitance reduction in the metal layer level M1. In the memory cell 30_3 of the IC 100C, the conductive lines with the thickness T1 have lower line resistance to improve write-cycle Vcc_min performance for the memory (e.g., SRAM). In other words, the memory cell 30_3 has less IR drop in the bit line BL and complementary bit line BLB during the write cycle in the write margin. Thus, high resistance concerns on bit line BL and the complementary bit line BLB of the SRAM are solved.

By using the conductive lines with the thicker thickness (e.g., the thickness T1) in the metal layer level M1 that function as the complementary bit line BLB and the bit line BL, the resistances of the complementary bit line BLB and the bit line BL are decreased in the memory cell 30. Therefore, when metal thickness and line width are continuously reduced, the memory cell 30 does not exhibit high resistance, and hence the cell speed and voltage (e.g., V_min) performance of the memory cell 30 is not impacted. Furthermore, the memory array formed by the memory cells 30 has less IR drop in the bit line BL and complementary bit line BLB during the write cycle in the write margin. Furthermore, the memory array formed by the memory cells 30 also has low line resistance in the bit line BL and complementary bit line BLB for RC delay reduction. Thus, array efficiency and speed are increased in the memory array.

Embodiments for semiconductor structures are provided. In the memory cells of an IC, the bit line BL, the complementary bit line BLB and the power line CVdd with the thicker thickness (e.g., the thickness T2) are arranged in the metal layer level M1, thereby bit-line capacitance and the resistances of the complementary bit line BLB, the bit line BL and the power line CVdd of the memory cell are decreased. Thus, IR drop in the bit line BL and complementary bit line BLB is decreased during write cycle in write margin, and RC delay is decreased due to lower line resistance in the bit line BL and complementary bit line BLB. Thus, array efficiency and speed are increased in the memory cell.

In some embodiments, a semiconductor structure is provided. The semiconductor structure includes a memory cell formed over a semiconductor substrate, and a logic cell formed over the semiconductor substrate. The memory cell includes a latch circuit formed by two cross-coupled inverters, and a pass-gate transistor coupling an output of the latch circuit to a bit line. A first source/drain region of the pass-gate transistor is electrically connected to the bit line through a first contact over the first source/drain region and a first via over the first contact. The logic cell includes a transistor over the semiconductor substrate. The second source/drain region of the transistor is electrically connected to a local interconnect line through the second contact over the second source/drain region and the second via over the second contact. The first via and the second via are the same height. The local interconnect line of the logic cell and the bit line of the memory cell are formed in the same metal layer, and the bit line is thicker than the local interconnect line.

In some embodiments, a semiconductor structure is provided. The semiconductor structure includes a memory cell formed over a semiconductor substrate, and a logic cell formed over the semiconductor substrate. The memory cell includes a latch circuit formed by two cross-coupled inverters, and a pass-gate transistor coupling an output of the latch circuit to a bit line. A first source/drain region of the pass-gate transistor is electrically connected to the bit line through a first contact over the first source/drain region and a first via over the first contact. The logic cell includes a transistor over the semiconductor substrate. the second source/drain region of the transistor is electrically connected to a local interconnect line through the second contact over the second source/drain region and the second via over the second contact. The height of the second via is greater than that of the first via. The interconnect line of the logic cell and the bit line of the memory cell are formed in the same metal layer, and the bit line is thicker than the local interconnect line.

In some embodiments, a semiconductor structure is provided. The semiconductor structure includes a memory cell formed over a semiconductor substrate, and a logic cell formed over the semiconductor substrate. The memory cell includes a latch circuit formed by two cross-coupled inverters, and a pass-gate transistor coupling an output of the latch circuit to a bit line. A first source/drain region of the pass-gate transistor is electrically connected to the bit line through a first contact over the first source/drain region and a first via over the first contact. The logic cell includes a transistor over the semiconductor substrate. The second source/drain region of the transistor is electrically connected to a interconnect line through the second contact over the second source/drain region and the second via over the second contact. The bottom surface of the interconnection line and the bottom surface of the bit line are coplanar. The local interconnect line of the logic cell and the bit line of the memory cell are formed in the same metal layer, and the bit line is thicker than the local interconnect line.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a memory cell formed over a semiconductor substrate, comprising:
   a latch circuit formed by two cross-coupled inverters; and
   a pass-gate transistor coupling an output of the latch circuit to a bit line,
   wherein a first source/drain region of the pass-gate transistor is electrically connected to the bit line through a first contact over the first source/drain region and a first via over the first contact; and
   a logic cell formed over the semiconductor substrate, comprising:
   a transistor over the semiconductor substrate, wherein a second source/drain region of the transistor is electrically connected to a local interconnect line through a second contact over the second source/drain region and a second via over the second contact, wherein the first via and the second via are the same height, wherein the local interconnect line of the logic cell and the bit line of the memory cell are formed in the same metal layer, and the bit line is thicker than the local interconnect line.

2. The semiconductor structure as claimed in claim 1, wherein each of the cross-coupled inverters of the memory cell is electrically connected to a power supply line, and the power supply line and the bit line are formed in the same metal layer, wherein the power supply line is thicker than the local interconnect line.

3. The semiconductor structure as claimed in claim 1, wherein the bit line of the memory cell is wider than the local interconnect line of the logic cell.

4. The semiconductor structure as claimed in claim 1, wherein the bit line and the first via in the memory cell are made of different materials.

5. The semiconductor structure as claimed in claim 1, wherein the bit line is made of a Cu-based material, and the first via is made of a W-based material.

6. The semiconductor structure as claimed in claim 1, wherein a contact area between the bit line and the first via of the memory cell is greater than a contact area between the local interconnection line and the second via of the logic cell.

7. The semiconductor structure as claimed in claim 1, wherein a top surface of the local interconnection line and a top surface of the bit line are coplanar.

8. The semiconductor structure as claimed in claim 1, wherein a top surface of the first via is higher than a bottom surface of the bit line.

9. A semiconductor structure, comprising:
a memory cell formed over a semiconductor substrate, comprising:
a latch circuit formed by two cross-coupled inverters; and
a pass-gate transistor coupling an output of the latch circuit to a bit line,
wherein a first source/drain region of the pass-gate transistor is electrically connected to the bit line through a first contact over the first source/drain region and a first via over the first contact; and
a logic cell formed over the semiconductor substrate, comprising:
a transistor over the semiconductor substrate, wherein a second source/drain region of the transistor is electrically connected to a local interconnect line through a second contact over the second source/drain region and a second via over the second contact,
wherein the first via and the second via are the same height and formed in the same via layer,
wherein the first via is in contact with the bit line and the second via is in contact with the local interconnect line, and a bottom surface of the bit line is lower than a top surface of the first via.

10. The semiconductor structure as claimed in claim 9, wherein a top surface of the local interconnection line and a top surface of the bit line are coplanar, and a bottom surface of the local interconnection line and a top surface of the second via are coplanar.

11. The semiconductor structure as claimed in claim 9, wherein the local interconnect line of the logic cell and the bit line of the memory cell are formed in the same metal layer, and the bit line is thicker than the local interconnect line.

12. The semiconductor structure as claimed in claim 9, wherein the bit line of the memory cell is wider than the local interconnect line of the logic cell.

13. The semiconductor structure as claimed in claim 9, wherein the bit line and the first via in the memory cell are made of different materials.

14. The semiconductor structure as claimed in claim 9, wherein a contact area between the bit line and the first via of the memory cell is greater than a contact area between the local interconnection line and the second via of the logic cell.

15. The semiconductor structure as claimed in claim 9, wherein each of the cross-coupled inverters of the memory cell is electrically connected to a power supply line, and the power supply line and the bit line are formed in the same metal layer, wherein the power supply line is thicker than the local interconnect line.

16. A semiconductor structure, comprising:
a memory cell formed over a semiconductor substrate, comprising:
a latch circuit formed by two cross-coupled inverters; and
a pass-gate transistor coupling an output of the latch circuit to a bit line,
wherein a first source/drain region of the pass-gate transistor is electrically connected to the bit line through a first contact over and contact with the first source/drain region and a first via over and contact with the first contact; and
a logic cell formed over the semiconductor substrate, comprising:
a transistor over the semiconductor substrate, wherein a second source/drain region of the transistor is electrically connected to a local interconnect line through a second contact over and contact with the second source/drain region and a second via over and contact with the second contact,
wherein the first via and the second via are the same height,
wherein the bit line is thicker than the local interconnect line so that wherein a top surface and a portion of side surface of the first via are in contact with the bit line.

17. The semiconductor structure as claimed in claim 16, wherein a top surface of the second via is in contact with the local interconnect line, and side surface of the second via is separated from the local interconnect line by an isolation layer.

18. The semiconductor structure as claimed in claim 16, wherein the bit line of the memory cell is wider than the local interconnect line of the logic cell.

19. The semiconductor structure as claimed in claim 16, wherein the bit line and the first via in the memory cell are made of different materials.

20. The semiconductor structure as claimed in claim 16, wherein a top surface of the local interconnection line and a top surface of the bit line are coplanar.

* * * * *